United States Patent
Wang

(10) Patent No.: US 6,374,395 B1
(45) Date of Patent: Apr. 16, 2002

(54) METHODOLOGY FOR GENERATING A DESIGN RULE CHECK NOTCH-ERROR FREE CORE CELL LIBRARY LAYOUT

(75) Inventor: Chung-Hsing Wang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/557,396

(22) Filed: Apr. 24, 2000

(51) Int. Cl.[7] ............................................... G06F 17/50
(52) U.S. Cl. ......................................................... 716/11
(58) Field of Search .............................. 716/4, 6, 8, 16, 716/17

(56) References Cited

U.S. PATENT DOCUMENTS

| | | | |
|---|---|---|---|
| 5,550,839 A | 8/1996 | Buch et al. | 371/22.1 |
| 5,754,826 A | 5/1998 | Gamal et al. | 395/500 |

Primary Examiner—Matthew Smith
Assistant Examiner—Thuan Do
(74) Attorney, Agent, or Firm—George O. Saile; Stephen B. Ackerman

(57) ABSTRACT

A new method has been provided whereby notch errors that can occur in placing via interconnects over layers of metal have been eliminated. A reference database contains all layout data for semiconductor device cells that are used to create the semiconductor devices. A cell layout is read from the reference database and placed on an intermediate data repository. For this cell, valid locations are determined where via connections must be established. Data for a test via are created, the device of the test via is aligned with and placed ("dropped") over a valid location thereby creating test site. The purpose of the test site is to validate that the via device is correctly aligned with the metal and without any notch errors. Cases where notch errors occur are identified, for those cases a metal form is created whereby the surface of the metal form is identical with the surface of the notch error. The original metal data is merged with the original via device data and the notch error data, thereby creating new metal data that is free of the notch error. The original metal data and the original test via data and the notch error data are purged, the new metal data are stored on a core cell library for further customer use.

14 Claims, 3 Drawing Sheets

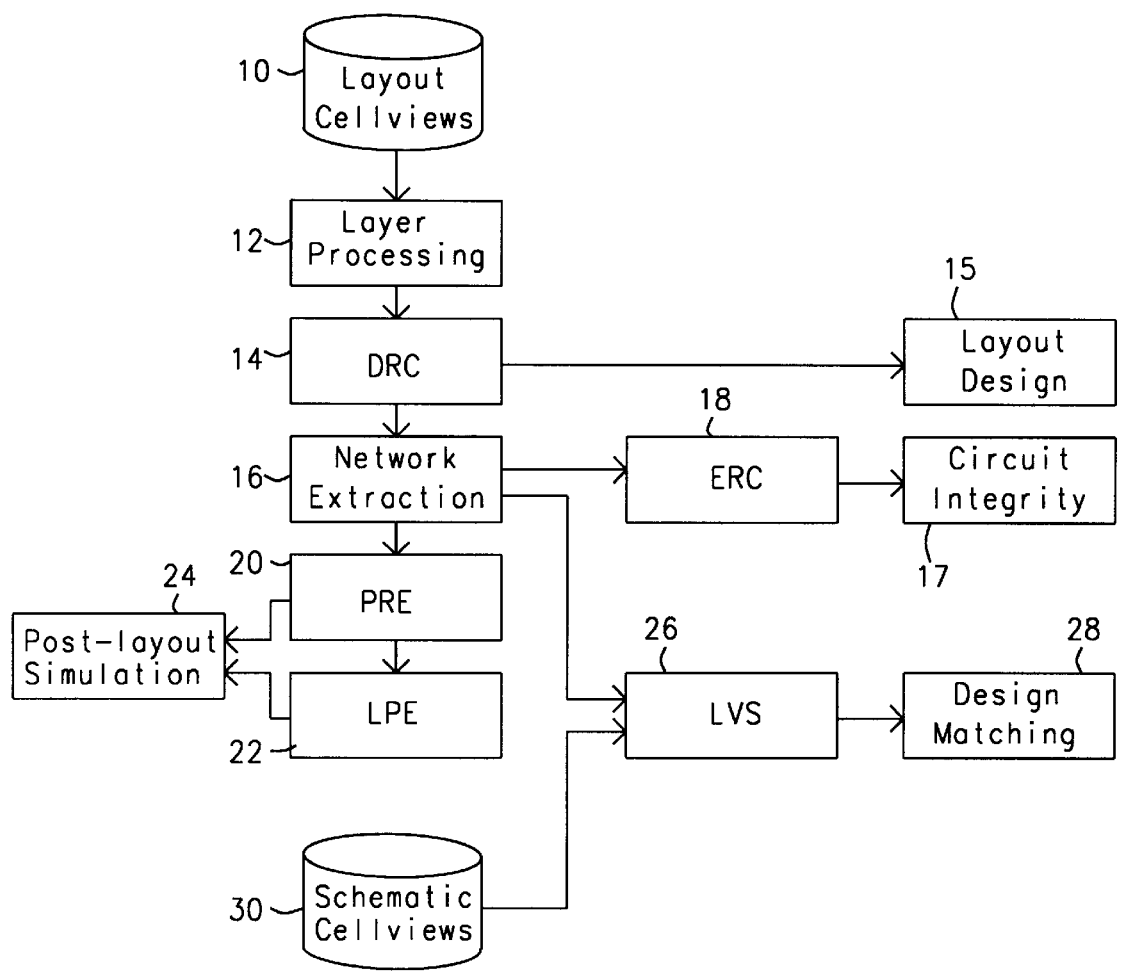
FIG. 1 - Prior Art
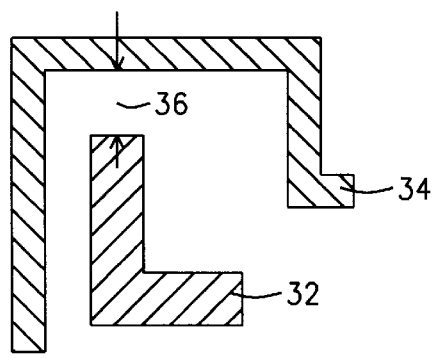
FIG. 2a - Prior Art

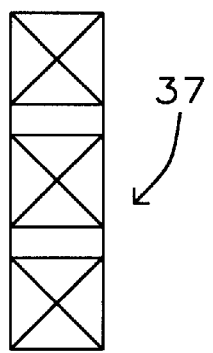
FIG. 2b – Prior Art
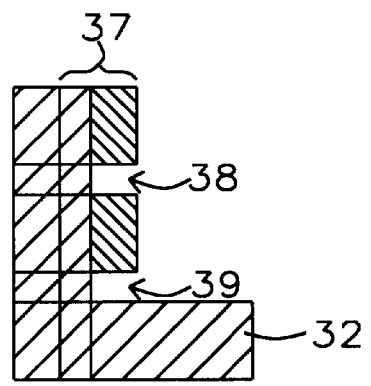
FIG. 2c – Prior Art
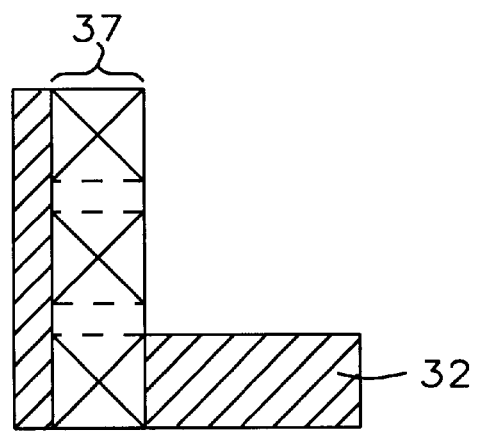
FIG. 2d – Prior Art

METHODOLOGY FOR GENERATING A DESIGN RULE CHECK NOTCH-ERROR FREE CORE CELL LIBRARY LAYOUT

BACKGROUND OF THE INVENTION (1) Field of the Invention

The invention relates to the fabrication of integrated circuit devices, and more particularly, to a method of creating a core cell library layout that is free of notch-errors when validated using a Design Rule Check (DRC) program.

(2) Description of the Prior Art

Computer Aided Design (CAD) has been an approach for creating chip designs and layout that has been in use for many years. CAD recognizes and makes use of applying the repetitive nature of chip design and chip layout by using sub-portions of the chip as chip building blocks that have known parameters of design and performance and that are known to be applied for particular functions within a overall functionality of a chip. CAD systems are software based whereby extensive libraries exist that contain the numerous chip-building blocks that are used in the creation of functional chips. The chip sub-functions or building blocks are represented by macros and are contained in a macro cell library. The macros that represent chip sub-functions can be used as input for extensive simulation and verification software that has as objective to analyze expected chip performance and that further allow for the manipulation of chip design parameters thereby effecting and in fact designing ultimate chip performance. It is clear that this approach provides a method that is practical and cost effective, most certainly if this method were to be compared with actually creating various chips of various design characteristics in order to evaluate new chip performance. This latter approach is not practical for many reasons, most notably the cost incurred and the time that is required for such an approach. The method of using CAD support software also makes it possible to realistically evaluate results that can be expected when semiconductor devices are created by different semiconductor vendors that typically have processing conditions and capabilities that vary significantly between vendors. In this manner a particular design can be assigned to the vendor that provides best technical results at the most competitive cost. Further, semiconductor device interconnectivity and the therewith-related aspects of device reliability can be evaluated both at fast turn-around time and at relatively low cost. Answers can in this manner be obtained in a matter of hours, an advantage without which actual design and innovation in a modern semiconductor manufacturing environment would be very difficult if not impossible to maintain. In short: software based support has been used for many years to enable chip design, the evaluation of new chip designs, the evaluation of chip functionality and reliability, the integration of chip sub-functions into larger chip designs and into multi-chip packages. Without such software support functions, semiconductor technology and the advancement of this technology would over the years have suffered serious negative impacts of technical innovation and competitive positioning within the industry.

The processes that are indicated above are, in most cases, aimed at creating mask images that are further used for multiple exposures using photolithographic processes. Using these processes, individual chip building blocks (represented and stored in a macro cell library that is under control of the software support functions) are combined to create combinations that are application specific, that is designs that are aimed ate one specific application of the overall semiconductor device. Most popular and most frequently used for these applications-specific designs are designs of electrically programmable read-only memory (EPROM) cells of which electrically erasable and electrically programmable read-only memory (EEPROM) are a special type, flash EEPROM cells which are specific types of both EPROM and EEPROM cells, standard cells and programmable logic devices. Masks for these devices are customized using CAD technology and are interconnected on an Integrated Circuit to form a partially completed IC.

The creation of a functional IC device typically starts with a description of the logic of the device, which is indicated by the logic functions of the device or the hardware description of the device. The initial logic functions of the device are simulated and verified using the CAD system support functions. After the logic functions have been satisfactorily evaluated in this manner, the hardware layout that implements the logic functions is synthesized. This process uses data that specifically reflects a given technology or a given processing sequence. These latter two pieces of data are typically stored in a data library and include specific parameters that reflect the processing conditions that will be applied to create to device functions. The reference library than contains standard device building blocks (in the form of macrocells) in addition to the specific design and processing rules that are used to combine the various individual sub-functions or device building blocks. The individual device macrocells need to be interconnected, which is performed using a placement and routing function of the CAD support software. The overall design and layout of the (in software) created device is evaluated and functionally simulated thereby again using processing-specific parameters that reflect the interconnect of the macrocells. If after this evaluation the overall device is acceptable in all aspects of the design (functionality, timing characteristics, loading effect including parasitic capacitive and parasitic resistive loading effects, reliability, density, surface area required for the device), the final mask for the device is created. Sample devices are made to validate the created mask and any modifications that may be required as a result of this latter (device) evaluation are implemented in a most cost-effective manner, typically correcting the mask. The final design of a device is typically stored on a macro cell library for future reference.

It is clear that, from a cost point of view, the above indicated cycle to create masks for chip manufacturing needs to be done in a cost-effective manner. This means that, for many of the applied designs, a robust or worst case design is performed and retained as macro cell data in the reference library. This to avoid doing design cycles repetitively for very specific designs. The worst case designs can be used as starting designs for other (specific) designs whereby specific and application dictated design parameters relating to parasitic influences, routing to interconnect device functions, expected processing conditions for the specific device (vendor), actual timing conditions and the like are incorporated into the worst case design. This latter incorporation is aimed at converting the worst-case design to a specific design, the specific design will after this incorporation of specific design conditions as yet need to be evaluated and simulated for the actual, specific fabrication and operating conditions of the device. One of the overriding factors in all of these efforts is that the cost of providing an ultimate mask for a semiconductor device remains competitive since, even though computer programs can be executed at great speed and provide extreme complexity and design support, even computer programs add to the cost of creating a mask whereby specifically simulation runs can require a significant amount of computer run time thereby incurring a significant amount of the cost of the mask. Methods must therefore be provided that simplify the process of creating masks or any other required medium that is used for the creation of cost competitive semiconductor devices. Since CAD methods play an integral role in this process, any method or procedure that advances the state of the art in using the CAD methods is a valuable addition to the support tools that are used for the creation of semiconductor devices.

U.S. Pat. No. 5,754,826 (Gamal et al.) shows a simulation system using Cadence and routing line information.

U.S. Pat. No. 5,550,839 (Buch et al.) shows a mask programmed IC using DRC and merging data.

SUMMARY OF THE INVENTION

A principle objective of the invention is to create a database that contains a basic cell library of semiconductor device cells whereby all cells that are contained in the database are free of notch errors in aligning metal layers with via connections.

In accordance with the objectives of the invention a new method has been provided whereby notch errors that can occur in placing via interconnects over layers of metal have been eliminated. A reference database contains all layout data for semiconductor device cells that are used to create the semiconductor devices. A cell layout is read from the reference database and placed on an intermediate data repository. For this cell, valid locations are determined where via connections must be established. Data for a test via are created, the device of the test via is aligned with and placed ("dropped") over a valid location thereby creating a test site. The purpose of the test site is to validate that the via device is correctly aligned with the metal and without any notch errors. Cases where notch errors occur are identified, for those cases a metal form is created whereby the surface of the metal form is identical with the surface of the notch error. The original metal data is merged with the original via device data and the notch error data, thereby creating new metal data that is free of the notch error. The original metal data and the original test via data and the notch error data are purged, the new metal data are stored on a core cell library for further customer use.

BRIEF DESCRIPTION OF THE DRAWINGS

FIG. 1 shows a Prior Art flow diagram of the various steps that are used for interactive chip design and layout verification.

FIG. 2 explains the occurrence of notch errors, as follows:

FIG. 2a shows two strips of metal-1,

FIG. 2b shows a via device that is used to create a via overlying the metal-1,

FIG. 2c shows the via device having been dropped over a strip of metal-1,

FIG. 2d shows the metal-1 strip after the notch error has been corrected in accordance with the process of the invention.

DESCRIPTION OF THE PREFERRED EMBODIMENTS

Figure 3:
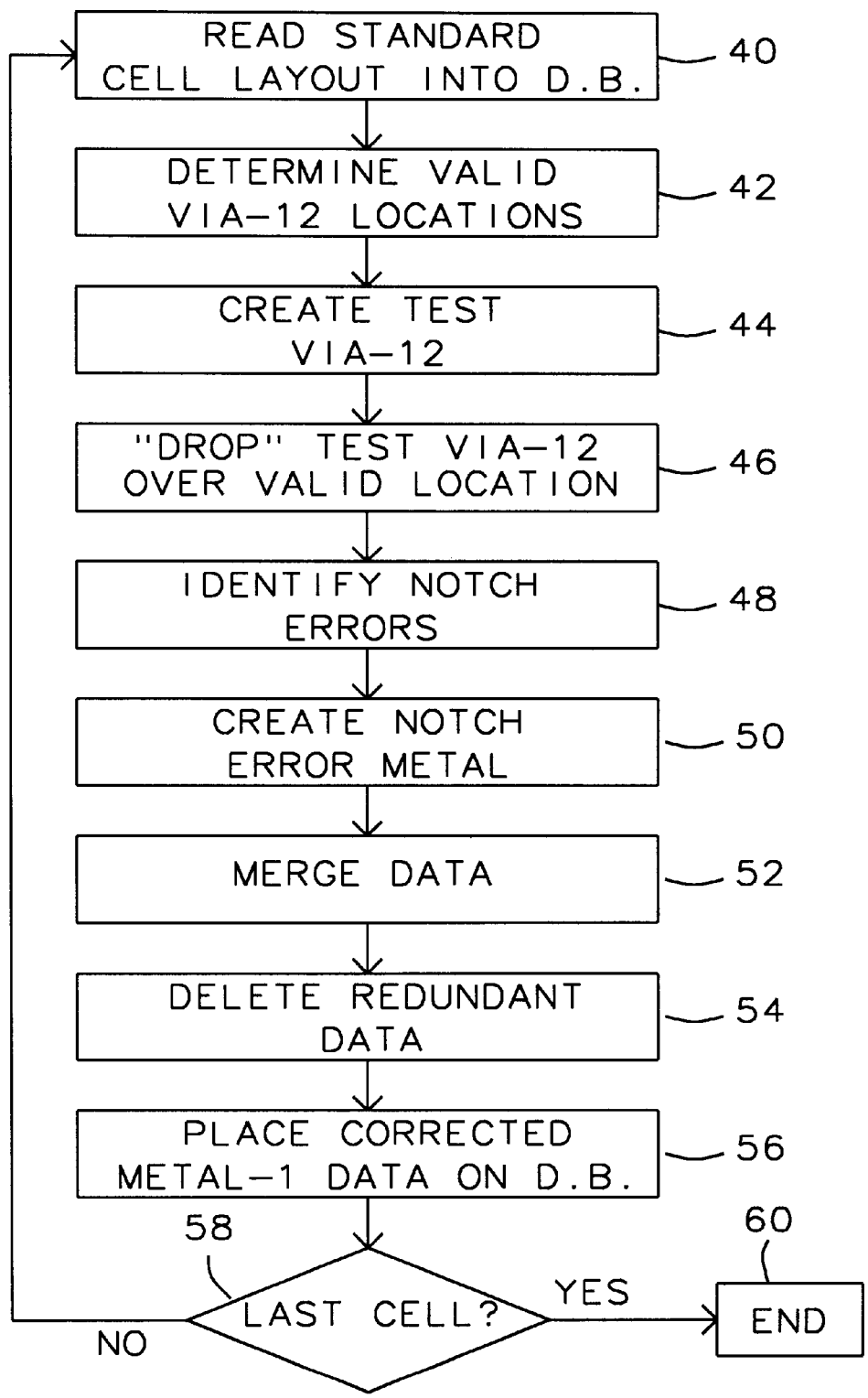
FIG. 3 shows a flow diagram of the processing steps of the invention.

As has been pointed out above, design of complicated chips is aided by the use of sophisticated verification programs that enable the user to quickly find and correct design errors. One of these support programs is the commercially available Diva system, which validates physical design and electrical functionality of a chip layout. The Diva support system also performs validations comparing device layout against circuit schematics. Errors can in this manner be located at an early stage in the design process and can be interactively viewed and corrected. The Diva system also allows for incremental evaluations of particular areas of chip layout, these areas can be rapidly evaluated and can be further changed.

The Diva functions can be broken down in the validation of Design Rules (using the Design rule Checker), a function that evaluates the occurrence and values of parasitic parameters (such as parasitic capacitance or parasitic resistance) that may be present in a given chip layout, a function that locates and further evaluates complex parameters and parasitics of physical devices within a complex chip layout, a function that validates electrical connectivity within a chip layout including for instance floating interconnects, and a function that checks for matching nets, devices and parameters in electrical networks. The invention focuses on the functions that are provided by the Design Rule Checker (DRC), FIG. 1 gives a brief overview of the system flow of which the DRC function is a part.

The process of chip design evaluation starts with evaluating the physical layout of the sub-sections or cells that make up the overall device, step 10, FIG. 1. Since this layout in many of the applications interacts with and is therefore dependent on adjacent layers, the layout of the various cells must be evaluated in combination with layer processing. Step 12, FIG. 1, shows the evaluation of the physical interdependency between the layouts of adjacent layers which assures that no conflict occurs in this layout. The DRC, step 14, FIG. 1, identifies any deviations that may be present in the design that relate to and are dictated by VLSI/ULSI design constraints. The DRC function evaluates constraint violations independent of technology and accommodates all layout methodologies, including full custom layout, structured custom layout, standard cell layout, macro cell, gate arrays and automated layout. DRC can specifically be used to validate material spacing, enclosure and overlap and performs these validations in an incremental manner thereby reducing computer execution time. The design layout can be validated by the display function 15, FIG. 1.

Further analysis of a chip layout and design can be performed by looking at individual nets that are contained within the design, step 16, FIG. 1. The Electric Rules Checking function, step 18, FIG. 1, can be invoked to evaluate identified individual nets and to provide the results of this analysis as a report on Circuit Integrity, step 17, FIG. 1.

Further detailed analysis of extracted nets can be performed by analyzing ohmic voltage drop (resistance extraction, step 20, FIG. 1) and by analyzing circuit/net parameters and parasitic components within an extracted net, step 22, FIG. 1. Any modifications or other conditions that relate to the component net performance parameters can be evaluated by a simulation function that simulates the impact of these parameters on net performance, step 24, FIG. 1.

As final processing steps in evaluating a particular design, layout versus schematic comparisons can be made, step 26, FIG. 1, for which network data are extracted from function 16, FIG. 1 while schematic data are extracted from a data base 30, FIG. 1 that contains schematics of the available and applied cells. Output results of the layout versus schematic comparison function (step 26) is provided as a report on the success or discrepancies that has been achieved in providing matching designs, step 28, FIG. 1.

From the above it is clear that the function of DRC is typically used to evaluate errors in the physical layout of the semiconductor chip. This requires time and effort in order to identify and locate errors and their locations after which as yet the identified error must be corrected. Specifically, the invention addresses errors that can occur in providing areas for metal interconnect between adjacent layers. These interconnects are typically provided by providing vias, these vias are used to interconnect connect two adjacent layers and are therefore referred to as VIA-12. One cell (or sub-component of a physical device layout) can contain many points or pins that need to be provided with via interconnects, the DRC tool is thereby used to identify notch errors that may exist for vias for the pins in a cell. From the above provided description of FIG. 1 it is clear that this check of correct via location (no notch errors) is required prior to invoking automatic placements and routing tools where simulation runs of these tools provide answers relating to the validity of a proposed layout and design.

Notch errors are explained using FIG. 2a and 2b. FIG. 2a shows two metal-1 strips, that is strips 32 and 34. Via-12 connects are to be provided to strip 32, for this purpose a via-12 device 37 that is shown in FIG. 2b is used. For complex chip layouts, a software program such as Cadence Auto Abgen is used to identify valid locations within the chip layout where the via-12 devices can be located and superimposed over the metal strip to which the via-12 connects must be established. For the example shown in FIG. 2, the via-12 device 37 is located (aligned with) the metal strip 32 and "dropped" over this strip. The results of this drop are shown in FIG. 2c, FIG. 2c shows a drop of a via-12 device that resulted in notch errors 38 and 39. These notch errors 38 and 39 are spacing errors within the shape of strip 32 and violate semiconductor device design rules. These spacings are to be avoided since they can lead to device failure. FIG. 2d shows the connect that is desired between the metal strip 32 (FIG. 2a) and the via-12 device 37 (FIG. 2b). It is clear that the notch errors are absent in FIG. 2d. Notch errors are identified by a software support package such as the Diva CRT checking program. It is the objective of the invention to provide a processing sequence that creates a database of cell layouts where the notch errors have been removed from the cell layouts. The parameter 36 that is indicated in FIG. 2a is a spacing between two adjacent patterns of metal and does not represent the problem (of notch creation) that is addressed by the invention.

FIG. 3 shows the processing sequence that leads to the objective of the invention, that is the elimination of notch errors in cell layouts.

The process of the invention starts (FIG. 3, step 40) with reading a standard cell layout into a database, the data base (not shown) is used as a repository of the required data during the process of the invention. This process of reading a standard cell layout uses conventional software support such as the industry standard Cadence Design Data Translation program. The data that is contained within the cell layout contains all data that is relevant and required to create the physical layout of the cell, essentially containing geometric parameters of the various shapes that make up the cell. This data for instance contains all numerical data (X/Y coordinates) that is required to identify and describe the metal strips that have previously been shown in FIG. 2a.

The next step (FIG. 3, step 42) is to identify all valid locations within the standard cell where via-12 connections must be made and where therefore via-12 devices must be aligned with these locations. This process is again performed by using a software support program such as the commercially available Cadence Auto Abgen program. A test via-12 is used to validate the presence or absence of notch shorts in the respective valid-12 locations, this test via-12 is created, FIG. 3, step 44.

Once these valid locations for the via-12 devices have been identified, the test via-12 device is positioned above these valid locations and put in place (dropped onto, FIG. 3, step 46) with respect to the metal strip to which these vias much be created. It is clear and has previously been stated that the vias interconnect adjacent levels of metal that is a via-12 interconnects a level of metal-1 with a level of metal-2.

At this time a check must be performed to assure that the via-12 devices has been placed correctly with respect to the interconnect metal (metal-1), FIG. 3, step 48. The DRC checking tool performs this analysis and as a result of this analysis identifies cell location where the above highlighted notch error has occurred. These locations must be further addressed with as objective the elimination of the notch error from the juncture of metal-1 and via-12 device.

For the cases where no notch error is identified, no corrective action needs to be taken and the process is reading in a standard cell is repeated. For cases where notch errors are identified, a special metal shape is created that has the exact geometric dimensions of the notch error, FIG. 3, step 50. The notch error and its surrounding layers of metal-1 are displayed on a cathode ray tube (CRT), this provides the ability to visually create the metal that fills in the surface areas of the notch error and to create all necessary parameters that identify these corrective metal notch areas.

At this time in the process, the data is available that represents the following metal-1 items: the original metal-1 strip to which via-12 devices must be created, the via-12 device that needs to be aligned with the metal-1 strip but that results in notch errors, the metal that fills the surface of the notch errors. All data that represent these three items are merged, FIGS. 3, step 52, thereby creating a new metal-1 strip shape. This new metal-1 now does not have the notch error since that notch error has been eliminated by the data that has been created to fill the surface of the notch error.

After this process of merging the data, there are now data that are no longer needed for the creation of a notch-free metal-1 strip, these data were used to make the original metal-1 to via-12 device match up and are the original metal-1 strip data, the original via-12 device data and the data of the corrective metal notch. These data therefore need to be purged from the system, FIG. 3, step 54, after which the data that represents the corrected metal-1 strip remain to be used for future applications. These latter data are therefore retained by storing these corrected cell layout data to a final repository database (FIG. 3, step 56) from which these data can be extracted for, for instance, customer use.

The process that has been described is executed for all cells that are contained in a database that contains all cell data. If not all cells that are contained in the database have been evaluated in the manner described above, the next cell is read into the data repository (FIG. 3, step 40) and analyzed as indicated. After all cells have been analyzed, the process of providing corrected metal-1 data that does not result in notch errors is terminated (FIG. 3, step 60).

The process of the invention can be summarized as follows:
1) read a standard cell layout into a data base whereby the data base is used as a data repository during the process of the invention 2) determine all valid locations where via-12 devices are to be connected to metal-1, this for all pins that are contained in a cell
3) create a test via-12 device (containing metal-1), this test via-12 to be used for successive testing at legal via-12 locations
4) "drop" the test via-12 over an identified valid location (where via-12 devices are to be connected)
5) identify notch errors for this latter valid location; for locations where a notch error is identified there is known the original metal-1 data and the test via-12 data
6) create a (metal-1) shape that has the same geometric configuration (shape) as the surface area of the identified notch error thereby creating notch error data
7) merge the original metal-1 data with the test via-12 data with the notch error data thereby creating corrected metal-1 data and thereby making the original metal-1 data and the test via-12 device data and the notch error data redundant
8) delete the original metal-1 data and the test via-12 device data and the notch error data thereby retaining the corrected metal-1 data, and
9) place the corrected metal-1 data on a data repository for further customer use.

The process of the invention has therefore resulted in creating a core cell library that contains cells that do not have notch errors since these notch errors have been removed by the process of the invention. Data that is used for device layout and device creation does therefore not have to be examined for the presence of notch errors which results in a significant savings in time during the design cycle.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a core macrocell library of semiconductor device cells whereby said semiconductor device macrocells are free of notch errors, comprising the steps of:

providing a first database that contains generic macrocell layout data;

providing a second database that functions as temporary data repository during the process of the invention whereby said second database temporarily contains all data that relate to the process of the invention;

reading generic macrocell layout data from said first database onto said second database thereby forming a generic circuit using said generic macrocell layout data and a generic alignment grid;

determining valid locations where via interconnects are to be provided for metal-1 layout that is contained within said generic macrocell layout data whereby a valid location is represented by original metal-1 data;

creating a test via device whereby said test via device is to be used for successive testing at valid locations where via interconnects are to be provided whereby said test via is represented by test via data;

"dropping" said test via over an identified valid location thereby establishing a test via site; identifying notch errors for this latter test via site;

creating, for locations where a notch error is identified, a shape that has the same geometric surface configuration as the surface area of said identified notch error thereby creating notch error data;

merging said original metal-1 data with said test via data with said notch error data thereby creating corrected metal-1 data and thereby making said original metal-1 data and said test via device data and said notch error data redundant;

deleting said original metal-1 data and said test via device data and said notch error data from said second database thereby retaining corrected metal-1 data on said second database;

placing the corrected metal-1 data on said core macrocell library for further customer use; and repeating the above steps starting with reading generic macrocell layout data from said first database into said second database and ending with placing the corrected metal-1 data on said core macrocell library said repetition to be continued up to the point where all generic macrocell layout data that are contained in said first database have been read from said first database.

2. The method of claim 1 whereby said notch errors are errors in alignment between original metal-1 data and via device data.

3. The method of claim 1 wherein said first database contains a generic library of generic macrocells whereby each of said macrocells represents process specific macrocells forming a processing technology.

4. The method of claim 1 wherein said generic macrocells represent, at least in part, elements that are selected from a group containing full custom layout macrocells and structured custom layout macrocells and generic macrocells layout and gate array macrocells.

5. The method of claim 1 wherein said generic cell layout data and said corrected metal-1 data maintain the same central origin relative to their respective alignment grids.

6. The method of claim 1 further comprising the step of performing a design rule check to determine if a final design of each corrected metal-1 data contained on said core macrocell library violates any design rules.

7. The method of claim 1 further comprising simulating said corrected metal-1 data contained on said core macrocell library using performance characteristics of said generic macrocell that contain said original metal-1 to verify that said corrected metal-1 data meets design and operational requirements as specified in said original metal-1 data.

8. The method of claim 1 further creating a set of masks using said corrected metal-1 data to enable manufacturing of said macrocells that are free of notch errors.

9. A computer readable storage medium containing software programs for creating a core macrocell library of semiconductor device cells whereby said semiconductor device core macrocells are tree of notch errors in surface areas where via connections are to be provided between layers of metal-1 and metal-2, said program comprising:

a generic library containing generic macrocell layout data that correspond to logic functions;

a program processing specific library containing temporary data files during the execution of the program of the invention whereby said program processing specific library temporarily contains all data that relate to the program of the invention;

a software routine for reading generic macrocell layout data from said generic library and placing said generic macrocell layout data onto said program processing specific library; a software routine to form a generic circuit using said generic macrocell layout data and a generic alignment grid;

a software routine to determine valid locations where via interconnects are to be provided for metal-1 layout that is contained within said generic macrocell layout data whereby a valid location is represented by original metal-1 data;

a software routine to create a test via device whereby said test via device is to be used for successive testing at said valid locations where via interconnects are to be provided whereby said test via device is represented by test via data;

a software routine to "drop" a test via over an identified valid location thereby establishing a test via site;

a software routine to identify notch errors for this latter test via site;

a software routine to create, for locations where a notch error is identified, a shape that has the same geometric surface configuration as the surface area of identified notch error thereby creating notch error data;

a software routine to merge said original metal-1 data with said test via data with said notch error data thereby creating corrected metal-1 data and thereby making said original metal-1 data and said test via device data and notch error data redundant;

a software routine to delete said original metal-1 data and said test via device data and said notch error data from said program processing specific library thereby retaining said corrected metal-1 data in said program processing specific library;

a software routine for placing the corrected metaled data on a core macrocell library for further customer use; and a software routine to repeat the above steps starting with said software routine for reading a generic macrocell layout data from said generic library into said program processing specific library and ending with said software routine for placing the corrected metal-1 data on said core macrocell library said repetition to be continued to the point where all generic macrocell layout data that are contained in said generic library have been read from said generic library.

10. The computer readable storage medium of claim 9 wherein said generic macrocells represent, at least in part, elements that are selected from a group containing full custom layout macrocells and structured custom layout macrocells and generic macrocells layout and gate array macrocells.

11. The computer readable storage medium of claim 9 wherein said generic cell layout data and said corrected metal-1 data maintain the same central origin relative to their respective alignment grids.

12. The computer readable storage medium of claim 9 further comprising software support for performing a design rule check to determine if the final design of each corrected metal-1 data contained on said third database violates any design rules.

13. The computer readable storage medium of claim 9 further providing software support for simulating said corrected metal-1 data contained on said third database using performance characteristics of said generic macrocell that contains said original metal-1 to verify that said corrected metal-1 data meets design and operational requirements as specified in said original metal-1 data.

14. The computer readable storage medium of claim 9 further providing software support for creating a set of masks using said corrected metal-1 data to enable manufacturing of said macrocells that are free of notch errors.

* * * * *